United States Patent [19]

Katagiri et al.

[11] 4,410,469
[45] Oct. 18, 1983

[54] METHOD FOR MANUFACTURING A MODULE FOR A FIBER OPTIC LINK

[75] Inventors: Shuhei Katagiri, Tokyo; Kenichi Donuma, Koshigaya; Makoto Ohashi, Kawasaki, all of Japan

[73] Assignee: Tokyo Shibaura Denki Kabushiki Kaisha, Kawasaki, Japan

[21] Appl. No.: 325,486

[22] Filed: Nov. 27, 1981

[30] Foreign Application Priority Data

Nov. 28, 1980 [JP] Japan ................................ 55-166686
Nov. 28, 1980 [JP] Japan ................................ 55-166687

[51] Int. Cl.$^3$ ............................................ G02B 5/174
[52] U.S. Cl. .................... 264/1.5; 29/569 L; 29/588; 264/272.15; 264/272.16; 264/272.17; 350/96.17; 350/96.2; 357/72
[58] Field of Search ............... 264/1.5, 272.17, 272.16, 264/272.15; 29/588, 569 L; 350/96.17, 96.20, 96.18; 357/72

[56] References Cited
U.S. PATENT DOCUMENTS

| | | | |
|---|---|---|---|
| 3,660,669 | 5/1972 | Grenon ............................ | 250/217 S |
| 3,667,000 | 5/1972 | Bergmans ......................... | 357/72 |
| 3,715,423 | 2/1973 | Dunn ............................... | 264/272.17 |
| 3,972,663 | 8/1976 | Taniguchi ........................ | 29/588 |
| 3,981,074 | 9/1976 | Yamamoto et al. ............. | 264/272.17 |
| 4,084,882 | 4/1978 | Hogan et al. ................... | 350/96.2 |
| 4,188,708 | 2/1980 | Frederiksen ..................... | 264/272.17 |
| 4,216,577 | 8/1980 | Badet et al. ..................... | 264/272.17 |
| 4,305,204 | 12/1981 | Toggart et al. .................. | 29/588 |

FOREIGN PATENT DOCUMENTS

| | | | |
|---|---|---|---|
| 2313688 | 2/1977 | France ............................. | 350/96.20 |
| 52-29749 | 5/1977 | Japan ............................... | 350/96.2 |
| 54-149468 | 11/1979 | Japan ............................... | 29/588 |
| 55-45095 | 3/1980 | Japan . | |
| 55-53307 | 4/1980 | Japan . | |
| 872521 | 7/1961 | United Kingdom ........... | 264/272.17 |

OTHER PUBLICATIONS

"Transfer Molding—Past, Present, and Future," Hull, *SPE Journal*, Jan. 1962, pp. 87–89.
"Module Package," Dion et al., *IBM Technical Disclosure Bulletin*, vol. 7, No. 7, Dec. 64, p. 557.

*Primary Examiner*—James B. Lowe
*Attorney, Agent, or Firm*—Cushman, Darby & Cushman

[57] ABSTRACT

In a method for manufacturing a module for a fiber optic link, a plate-shaped transparent circuit unit is molded in advance. The circuit module is transfer molded together with an optoelectronic element connected to leads. The circuit module is clamped between a pair of rod-shaped first dies which have a common central axis and one of which defines an optical path of the module, in such a manner that the optoelectronic element is located on a central axis of the circuit module. Under this condition, the circuit module is housed in a cavity defined by a pair of second dies. A light-shielding molding material is injected into the cavity for injection molding to mold a case. After the case is cured, the first and second dies are removed, and the hole of the case formed by one of the first die is closed with a cap to complete a receptacle.

11 Claims, 10 Drawing Figures

METHOD FOR MANUFACTURING A MODULE FOR A FIBER OPTIC LINK

BACKGROUND OF THE INVENTION

The present invention relates to a method for manufacturing a module for a fiber optic link and, more particularly, to a method for manufacturing a transmitter and receiver module for a fiber optic link.

In a fiber optic link useful, an optical signal generated in a transmission module is guided to an optical fiber cable, is transmitted through the fiber cable, and is detected in a receiver module to be converted into an electric signal. In a fiber optic link of this type, optical communication between the fiber cable and the receiver and transmitter modules, that is, the modules, is important. In other words, it is required that the optical axis of an optoelectronic element in a module, that is, a photodiode in the receiver module or an LED (Light Emitting Diode) in the transmitter module, be aligned with the optical axis at the end face of the optical fiber of the fiber cable in a precise manner, for example, within an error allowance of several to several tens of microns. In a conventional fiber optic link, a LED or photodiode as a single component is assembled in the transmitter module or in the receiver module. For this reason, the alignment of these electrical components and the optical fiber is not easy, and it is difficult to satisfactorily improve the light transmitting efficiency.

SUMMARY OF THE INVENTION

It is an object of the present invention to provide a method of manufacturing a module for a fiber optic link wherein an optical axis at the end face of an optical fiber may be aligned with an optical axis of an optoelectronic element in the module with high precision by simply mounting the optical fiber cable.

It is another object of the present invention to provide a method for manufacturing a module for a fiber optic link suitable for mass production.

In order to achieve the above and other ends, the present invention provides a method for manufacturing a module for a fiber optic link comprising the steps of:

transfer molding a transparent first member which has a predetermined shape, in which is embedded an optoelectronic element, and which is electrically connected to leads extending outwardly therefrom;

clamping said first member between a pair of first dies of rod shape which have a common central axis and one of which defines an optical path in the module, so that said optoelectronic element of said first member is positioned on said central axis;

injection molding a second member by positioning said first member clamped by said first dies in a cavity of second dies conforming to an outer shape of said second member, and injecting a light-shielding molding material in said cavity; and removing said first and second dies and covering, with a cap, a hole of said second member formed by the other of said first dies.

DETAILED DESCRIPTION OF THE PREFERRED EMBODIMENTS

Figure 1:
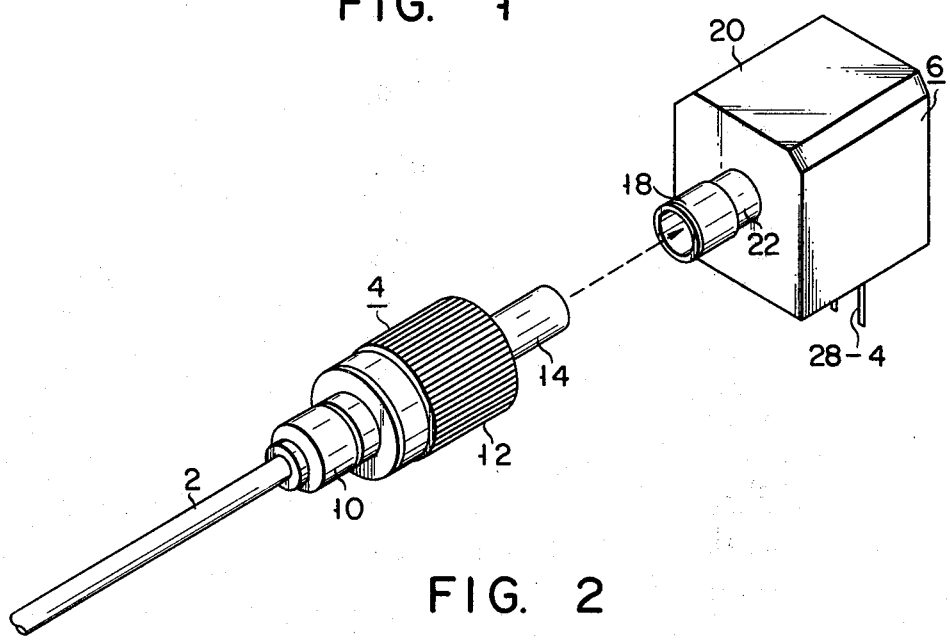
FIG. 1 is a perspective view showing a fiber optic link including a module according to one embodiment of the present invention.

FIG. 1 shows the receiver side of a fiber optic link. The receiver side includes an optical fiber cable 2, a connector 4 fixed to one end of the fiber cable 2, and a module (receiver module) 6 to which is mounted the connector 4. Although not shown, the transmitter side of the fiber optic link is of substantially the same structure as that of the receiver side. The internal structure of the module is also the same for both the transmitter and receiver sides except for the circuit elements and the optoelectronic element assembled in each module. Therefore, although the description will be made only with reference to the module, it is to be understood that the module refers both to the receiver module and the transmitter module.

Figure 2:
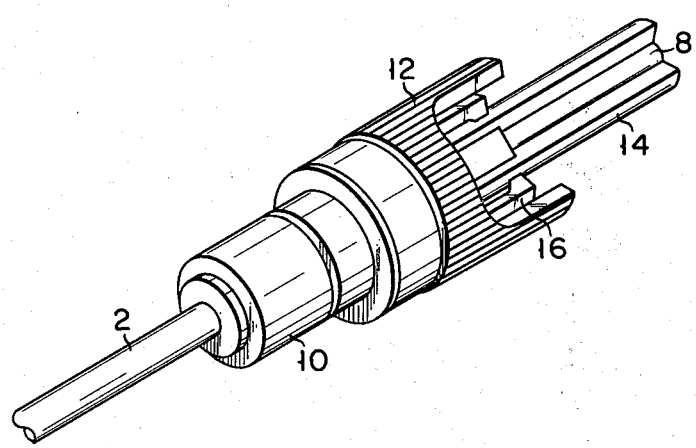
FIG. 2 is a partially cut away perspective view showing the connector shown in FIG. 1.
Figure 3:
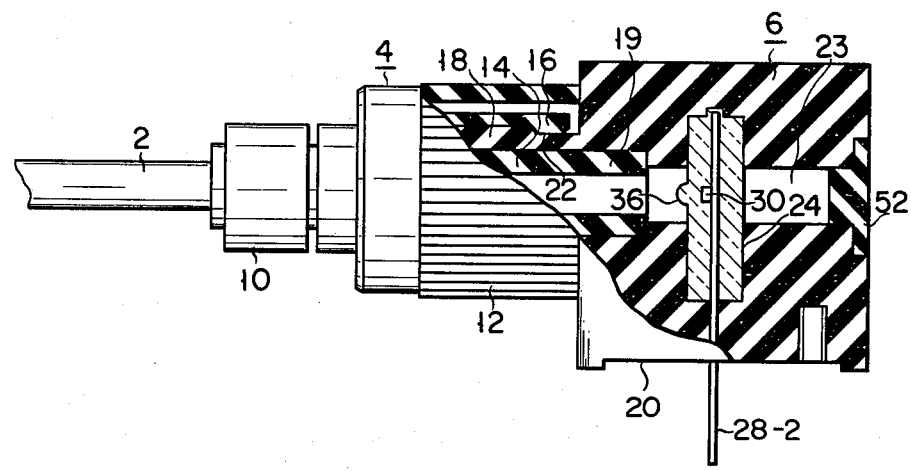
FIG. 3 is a partially sectional view showing the module and the connector shown in FIG. 1 under the coupled condition.
Figure 4:
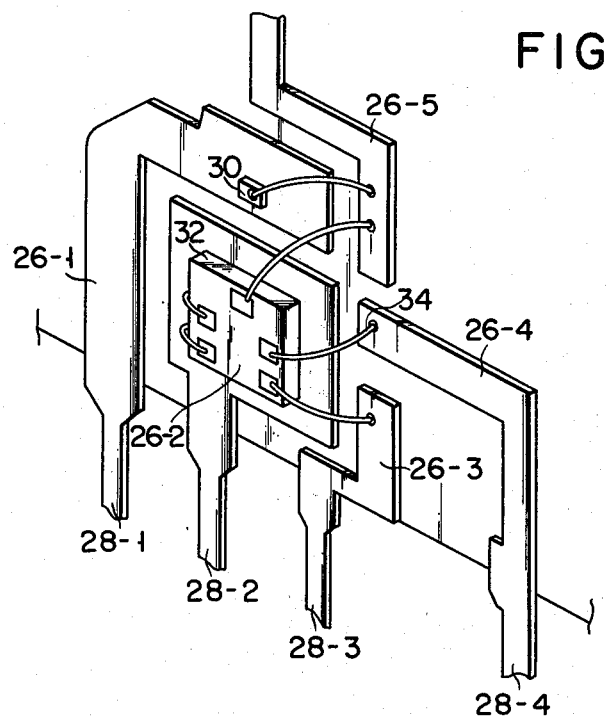
FIG. 4 is a perspective view showing the internal structure of the circuit unit shown in FIG. 3.

The optical fiber cable 2 is obtained in a generally known method by covering a glass or plastic optical fiber 8 comprising of a core and a cladding with a flexible light-shielding material. The connector 4 is manufactured by injection molding. As shown in FIG. 2, the optical fiber cable 2 is fixed to a fixing section 10 of the connector 4. The optical fiber cable 2 further extends inside a cylindrical rigid plug 14 coaxially projecting from the fixing section 10 and terminates at the front end of the plug 14. A snap piece 16 is arranged inside a knurled section 12. A cylindrical socket 18 projects from a main body case 20 to correspond with the cylindrical rigid plug 14. The inner diameter of the socket 18 is set to be substantially equal to or slightly greater than the outer diameter of the plug 14. The outer diameter of the socket 18 is also set to be slightly greater than a distance between projections of the snap piece 16 facing each other. As shown in FIG. 3, a stepped section 22 is formed at the socket 18 so as to engage with the snap piece of the connector 4 when the connector 4 is mounted to the socket 18. The hole 19 of the socket 18 in which is inserted the plug 14 communicates with a space 23 which extends inside the main body case 20 and which houses a circuit unit 24. As will be described later, the receiver module 6 is manufactured by injection molding as in the case of the connector 4. In contrast with this, the circuit unit 24 is manufactured by transfer molding. The receiver module 6 and the connector 4 are made of a light-shielding material which does not transmit light, while the circuit unit 24 is made of a transparent resin. As shown in FIG. 4, within the circuit unit 24 are embedded five Ag-plated lead frames 26-1, 26-2, 26-3, 26-4 and 26-5. The lead frame 26-5 extends to and terminates at one side of the unit 24, while the other lead frames 26-1, 26-2, 26-3 and 26-4 extend to the outside the unit 24 at the other side and terminate into pins 28-1, 28-2, 28-3 and 28-4. On the lead frame 26-1 is mounted through a conductive paste an optoelectronic element 30, an LED pellet in the case of the transmitter module and a photodiode in the case of the receiver module. On the lead frame 26-2 is mounted through a conductive paste a transducer circuit element corresponding to the optoelectronic element 30, that is, an IC chip 32 in which a circuit, for example, an amplifier, a comparator and related components or a driver circuit is formed. The bonding pads of the optoelectronic element 30, the IC chip 32 and the lead frames 26-1, 26-2, 26-3, 26-4, and 26-5 are electrically connected through gold bonding wires 34. The optoelectronic element 30 is embedded at a predetermined position of the unit 24 so that the optoelectronic element 30 opposes at a distance the hole 19 of the socket 18 and is aligned with the central axis of the hole 19, when the end of the circuit unit 24 is mounted within the main body case 20. A convex lens segment 36 is formed at the region of the unit 24 where the optoelectronic element 30 is embedded, as shown in FIG. 3.

Figure 5:
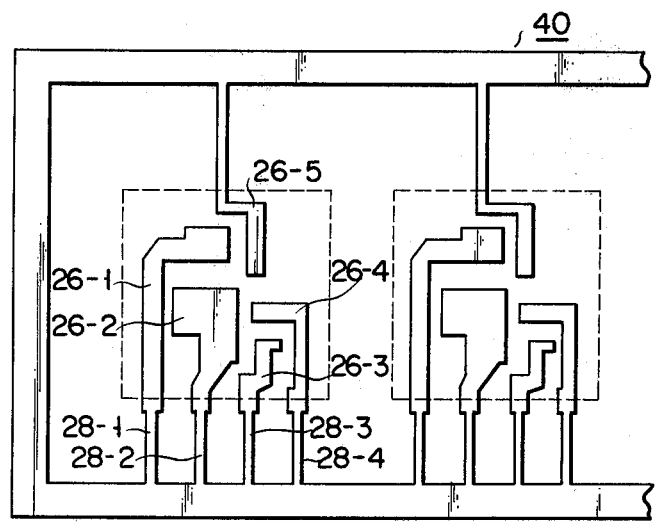
FIG. 5 is a plan view showing a frame for manufacturing the circuit unit shown in FIG. 3.

The method for manufacturing the module 6 as described above will now be described. Prior to the formation of the circuit unit 24, a copper plate is punched into a desired shape and is Ag-plated to provide a frame 40 as shown in FIG. 5. Next, the IC chip 32 and the optoelectronic element 30, that is, the LED or the photodiode, are mounted on the lead frames 26-1 and 26-2 with a conductive paste to be electrically connected thereto. The optoelectronic element 30 is connected to the lead frame 26-5 with a gold bonding wire having a diameter of 25 μm. The bonding pads of the IC chip 32 are respectively connected to the lead frames 26-2, 26-3, 26-4, and 26-5 with the bonding wires. The frame 40 with the IC chip 32 and the optoelectric element 30 is mounted in a pair of dies (not shown) having a cavity of a predetermined contour. Into this cavity defined by these dies is transferred a transparent thermosetting resin, for example, a transparent thermosetting epoxy resin MP-8500 maunufactured by Nitto Denshi-kogyo K.K., under certain conditions, for example, at a temperature of 160° C. and a pressure of 30 kg/cm². After curing, the unit 24 as shown in FIG. 3 is transfer molded.

Figure 6:
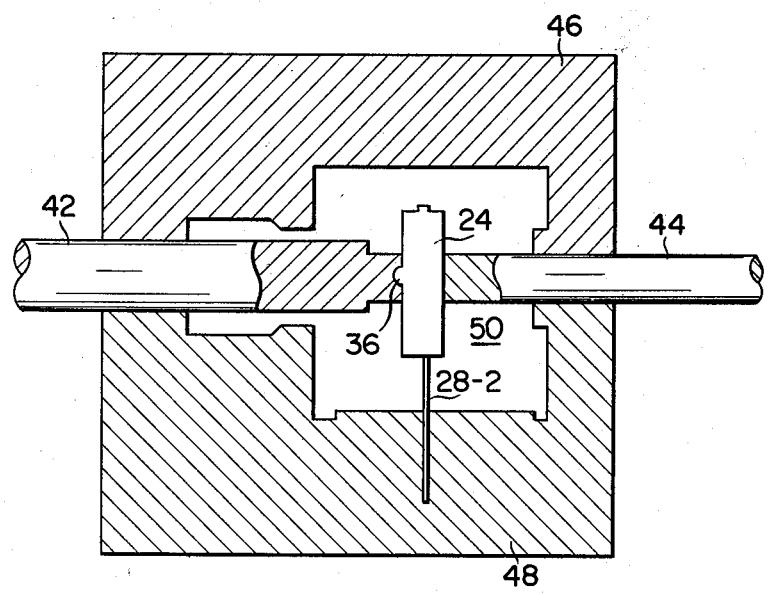
FIG. 6 is a sectional view showing dies used for inserting the circuit unit shown in FIG. 3 into the module.

The unit 24 obtained by the transfer molding in this manner is embeded in the case 20 which is obtained by injection molding. The unit 24 is clamped between a first die rod 42 and a second die rod 44. The first die rod 42 has an outer diameter substantially equal to the inner diameter of the hole 19 and has, at its front end, a recess conforming to the shape of the front part of the unit 24, as shown in FIG. 6. When the unit 24 is clamped between the pair of die rods 42 and 44, the optical axis of the optoelectric element 30 and the lens segment 36 is aligned with the central axis of the die 42. Under this condition, a pair of dies 46 and 48 are attached to define therebetween a cavity 50, which corresponds to the shape of the case 20. The die rods 42 and 44 and the dies 46 and 48 are kept at a temperature lower than a constant temperature, for example, 80° C. Into this cavity is injected a black thermosetting epoxy resin EME-155F manufactured by Sumitomo Bakelite K.K. under certain condition, for example, at a temperature of 165° C. and a pressure of 80 kg/cm². When the resin is cured, the die rods 42 and 44 are removed and the dies 46 and 48 are withdrawn. A cap 52 for shielding light from outside is covered over the hole 23 formed in the case 20 to complete the module as shown in FIGS. 1 and 3. According to this manufacturing method, since the optical axis of the optoelectronic element 30 and the lens segment 36 of the unit 24 is aligned with the central axis of the die rod 42 in advance, the optoelectronic element 30 and the lens segment 36 are correctly aligned with the hole 19 of the socket 18 and the case 20 of the completed module 6.

In the embodiment described above, the unit 24 is obtained by transfer molding. Therefore, during the manufacture of the unit 24, the bonding wires 34 may not be disconnected with the material to be transfer molded, and the optoelectronic element 30 and the IC chip 32 may not be distorted very much. In contrast with this, the case 20 is obtained by injection molding. Therefore, the case 20 is manufactured with high precision, so that the abrasion resistance and mechanical strength of the case may be improved. Furthermore, according to the injection molding process, the curing time of the molding material can be shortened. Therefore, even when the die rod 42 as shown in FIG. 6 is used, the introduction of the molding material into a space between the surface of the lens segment 36 of the module 24 and the front end surface of the die rod 42 may be prevented and the covering of the surface of the lens segment 36 with the light-shielding material may be prevented.

In the embodiment described above, the module 6 may be made small in size, and the time required for manufacturing it may be shortened. Moreover, since the central axis of the hole 19 of the module 6 is correctly aligned with the optical axis of the optoelectronic element 30 and the lens segment 36, the fiber cable 2 may be correctly optically coupled with the optoelectronic element 30 by only coupling the fiber cable 2 with the module 6 through the connector 4.

Figure 7:
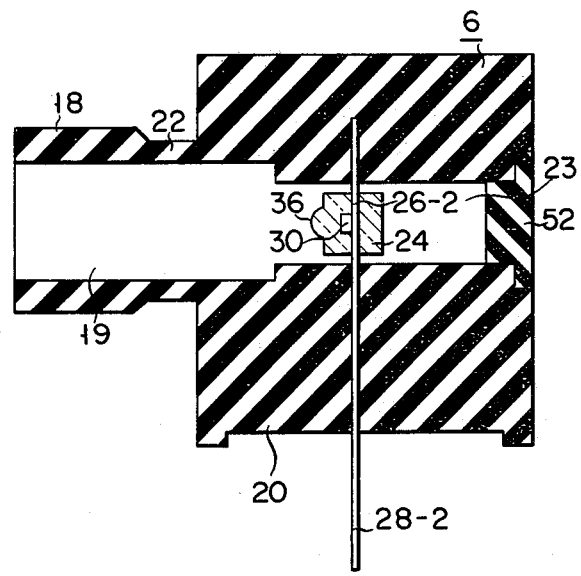
FIG. 7 is a sectional view showing the structure of a module according to another embodiment of the present invention.
Figure 8:
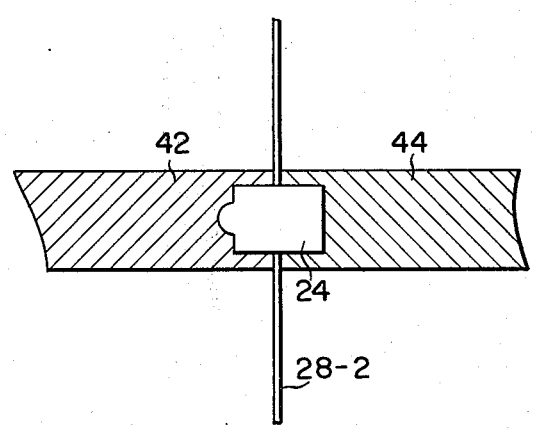
FIG. 8 is a view showing die rods for manufacturing the module shown in FIG. 7.

In the embodiment shown in FIG. 3, the end of the unit 24 is embedded in the case 20. However, as shown in FIG. 7, it is preferable that the unit 24 be formed in the space or hole 23 at a distance from the inner surface of the case 20, depending upon the molding conditions of the case 20. If part of the surface of the unit 24 is brought into contact with the molding material for injection molding as in the case of FIG. 3, the surface of the unit 24 may be subjected to a high temperature and a high pressure during injection molding, and the unit 24 may be damaged by the mechanical force or heat and the characteristics may change. In order to solve this problem, it is preferable to use the die rods 42 and 44 to manufacture the module 6 of the structure as shown in FIG. 7. As shown in FIG. 8, the die rod 42 has a recess which receives not only the front end surface but the front part of the unit 24, and the die rod 44 has a recess which receives the rear part of the unit 24. The case 20 is injection molded under the condition that the unit 24 is positioned in the cavity defined by these die rods 42 and 44. In this case, even when the unit 24 is subjected to the mechanical force or heat during injection molding, the unit 24 is protected by the die rods 42 and 44, and the IC chip 32 and the optoelectronic element 30 are protected.

Figure 9:
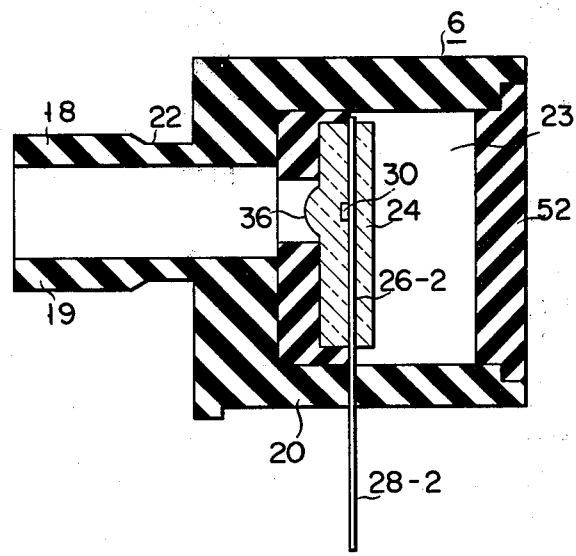
FIG. 9 is a sectional view showing the structure of a module according to still another embodiment of the present invention.
Figure 10:
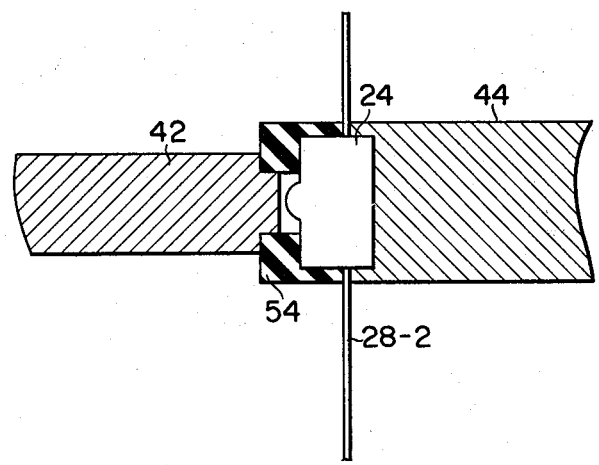
FIG. 10 is a sectional view showing die rods for manufacturing the module shown in FIG. 9.

In the embodiment shown in FIG. 7, the transparent unit 42 is supported in the case 20 by the lead frame to maintain a distance between the module 24 and the case 20. Alternatively, as shown in FIG. 9, a ring-shaped spacer 54 of a heat-insulating material such as ceramic or resin may be arranged between the inner surface of the case 20 and the surface of the front part of the unit 24. For manufacturing the module 6 as shown in FIG. 7, the ring-shaped spacer 54 is fitted at the front end of the die rod 42 as shown in FIG. 10. The unit 24 is clamped between this spacer 54 and the die rod 44, and the unit 24 is fitted with the spacer 54 so that the optical axis of the lens segment 36 and the optoelectronic element 30 is aligned with the central axis of the die rod 42. According to this method, the unit 24 is clamped through the spacer 54 and the spacer 54 remains inside the case 20. Therefore, even when the size of the unit 24 is made greater, the unit 24 may be correctly aligned by only preparing the spacer of a shape conforming to the front part of the unit 24. The outer diameter of the die rod 42 is determined by the outer diameter of the plug 14. Since the die rod 42 is withdrawn after the molding, the front end of it may not be made larger. However, if the spacer 54 is used, the positioning of the unit 24 may be correctly accomplished while the size of the unit 24 may be made greater. If the size of the unit 24 may be made greater, the size of the frame 40 and the arrangement of the optoelectronic element 30 and the IC chip 32 inside the unit 24 may be more freely selected, so that the manufacture of the unit 24 is facilitated and mass production of it is also facilitated.

In summary, according to the module of the present invention, the optoelectric element such as an LED or a photodiode and the peripheral circuits formed into an IC chip is embedded in a molded body or unit. The case is manufactured in correspondence with this molded body. Therefore, correct alignment may be achieved by simply connecting the fiber optic cable to the module through the connector. Since this manufacturing method is suitable for mass production, the unit price of the module may be reduced.

What we claim is:

1. A method for manufacturing a module for a fiber optic link comprising the steps of:
    (a) transfer molding a transparent first member having a predetermined shape and an optoelectric element embedded therein, said optoelectric element being mounted on one of a plurality of leads extending outwardly from said first member;
    (b) clamping said first member between a pair of coaxially opposing, reciprocably movable first rod-shaped dies, one of said first dies defining an optical path in the module while simultaneously positioning said optoelectric element coaxially with respect to said pair of rod-shaped dies and said optical path;
    (c) injection molding a second member by positioning said first member clamped by said first dies in accordance with step (b) in a cavity defined by a pair of second dies conforming to a predetermined shape of said second member, and injecting a light-shielding molding material into said cavity;
    (d) removing said first and second pairs of dies; and
    (e) covering, with a cap, a hole defined in said member, said hole being formed by the other of said first dies after step (d) is practiced.

2. A method according to claim 1, wherein step (c) is practiced by embedding a portion of said first member in said second member.

3. A method according to claim 1, wherein during practice of step (b), said first dies define a cavity conforming to an outer shape of said first member, said first member being housed in said cavity when said first member is clamped; and, wherein during practice of step (c), a portion of said leads extending outwardly from said first member is embedded in said second member so that said first member is fixed to said second member.

4. A method according to claim 1, wherein step (b) is practiced by arranging a spacer between one of said first dies and said first member, and said first member is clamped between said first die through said spacer.

5. A method according to claim 4, wherein during practice of step (b), said first dies define a cavity conforming to an outer shape of said first member with said spacer, and said first member and said spacer are housed in said cavity when said first member and said spacer are clamped; and wherein during practice of step (c), a portion of said leads extending outwardly from said first member is embedded in said second member, so that said first member is fixed to said second member.

6. A method according to claim 1, wherein said first member has a convex lens segment formed on an optical axis of said optoelectric element.

7. A method according to claim 1, wherein said second member has a socket to which is mounted a fiber cable connector and which has a hole formed by one of said first dies and defining the optical path of the module.

8. A method according to claim 1, wherein an inner diameter of said hole is substantially equal to an outer diameter of a plug of said fiber cable connector.

9. A method according to claim 6 wherein said one of said first dies includes means defining a coaxially disposed, concave recessed surface, and wherein step (b) is practiced by mating said convex lens with said concave recessed surface, said lens segment thereby being coaxially disposed relative said first pair of dies.

10. A method of manufacturing a module for a fiber optic link using a pair of first dies each having opposing end portions, said first pair of dies reciprocably and coaxially movable relative to one another, and a pair of second dies defining a cavity, said second pair of dies transversely positioned with respect to said pair of first dies and reciprocably movable to clamp said first pair of dies so that said end portions are within said cavity, said method comprising the steps of:
    (a) transfer molding a transparent first member having a predetermined shape and an optoelectric element embedded therein, said optoelectric element being operatively coupled to one of a plurality of leads outwardly extending from said first member,
    (b) coaxially positioning said optoelectric element between said pair of opposing first dies,
    (c) clamping said first member between said end portions of said pair of first dies after said optoelectric element is coaxially positioned according to step (b),
    (d) positioning said first member clamped according to step (c) in said cavity and injecting a light-shielding molding material into said cavity,
    (e) removing said first and second dies, one of said first dies after removal defining an optical path in said module, said optical path being coaxially aligned with said optoelectric element, the other of said first dies after removal defining an aperture in said module, said aperture coaxially opposing said optical path, and
    (f) covering said aperture with a light-shielding cap, whereby said optoelectric element is coaxially positioned with respect to said optical path and whereby simultaneous optical alignment and molding of said module is effected by virtue of said clamping relationship of said first member between said pair of first dies.

11. A method of manufacturing a module for a fiber optic link using a first pair of coaxially opposing dies each reciprocably movable with respect to one another and having opposing end portions, one of said dies of said first pair at the respective end portion including means defining a recessed surface coaxially disposed with respect to said first pair, and a second pair of dies defining a cavity and transversely positioned with respect to said first pair of dies, said second pair being reciprocably movable to clamp said first pair of dies so that said end portions are within said cavity, said method comprising the steps of:

(a) transfer molding a transparent first member having a convex lens in optical alignment with an optoelectric element embedded therein, said optoelectric element being operatively coupled to one of a plurality of leads outwardly extending from said first member, (b) coaxially positioning said optoelectric element between said first pair of opposing dies by matingly positioning said convex lens in said recessed surface defining means, (c) clamping said first member between said end portions of said first pair of dies after said optoelectric element is coaxially positioned according to step (b), (d) positioning said first member clamped according to step (c) in said cavity and injecting a light-shielding molding material into said cavity, (e) removing said first and second pairs of dies, one die of said first pair after removal defining an optical path in said module, said optical path being coaxially aligned with said optoelectric element, the other die of said first pair after removal defining an aperture in said module, said aperture coaxially opposing said optical path, and (f) covering said aperture with a light-shielding cap, whereby said optoelectric element is coaxially positioned with respect to said optical path and whereby simultaneous optical alignment and molding of said module is effected by virtue of said clamping relationship of said first member between said first pair of dies.

* * * * *